(12) United States Patent
Knotter

(10) Patent No.: US 6,497,238 B1
(45) Date of Patent: Dec. 24, 2002

(54) METHOD OF MANUFACTURING ELECTRONIC DEVICES AND APPARATUS FOR CARRYING OUT SUCH A METHOD

(75) Inventor: Dirk Maarten Knotter, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 208 days.

(21) Appl. No.: 09/723,133

(22) Filed: Nov. 27, 2000

(30) Foreign Application Priority Data

Nov. 26, 1999 (EP) .............................. 99203978

(51) Int. Cl.$^7$ .................. H01L 21/302; C25F 5/00; C23F 1/00
(52) U.S. Cl. .............. 134/1.3; 156/345.15; 156/345.18; 216/84; 216/90; 216/93; 216/97
(58) Field of Search ............................. 216/84, 90, 93, 216/97, 99; 134/1.3; 156/345.15, 345.18

(56) References Cited

U.S. PATENT DOCUMENTS 5,788,801 A    8/1998   Barbee et al. .............. 156/345
6,415,803 B1 * 7/2002   Sundin et al. .............. 134/113

FOREIGN PATENT DOCUMENTS

GB    2332091 A      6/1999
JP    09-022891   *  1/1997

OTHER PUBLICATIONS

"In–Situ Chemical Concentration Control for Wafer Wet Cleaning", by Ismail Kashkoush et al., Mat. Res. Soc. Symp. Proc. vol. 477 1997.

* cited by examiner

Primary Examiner—George Goudreau
(74) Attorney, Agent, or Firm—Aaron Waxler

(57) ABSTRACT

A method of manufacturing electronic devices, in particular, but not exclusively, semiconductor devices, and apparatus for carrying out such a method, in which method substrates 1, which are provided at a surface 2 with a silicon oxide-containing material 3 to be removed, are subjected, while being divided into successive batches, to a wet treatment in a bath 4 containing a solution 5 of hydrofluoric acid in water. During this wet treatment the conductivity of the solution 5 is monitored and the silicon oxide-containing material 3 is removed, thereby forming ionic components. The monitored conductivity is brought to approximately a desired conductivity at time intervals by adding hydrofluoric acid and/or water to the solution 5 inside the bath 4.

In order to improve the process stability of the wet treatment of the successive batches of substrates 1 in the solution 5 of hydrofluoric acid in water, and to lengthen the lifetime of the solution 5, the solution 5 is provided with a basic component MX prior to the wet treatment so that the monitored conductivity of the solution 5 decreases as a result of the removal of the silicon oxide-containing material in between the time intervals of the wet treatment. The basic component MX comprises a cation $M^{(+)}$, which is different from $H^+$, and an anion $X^{(-)}$, which anion is a conjugated base of a weak acid.

9 Claims, 3 Drawing Sheets

METHOD OF MANUFACTURING ELECTRONIC DEVICES AND APPARATUS FOR CARRYING OUT SUCH A METHOD

BACKGROUND OF THE INVENTION

The invention relates to a method of manufacturing electronic devices, in particular, but not exclusively, semiconductor devices, in which method substrates, which are provided at a surface with a silicon oxide-containing material which is to be remove later, are subjected, while being divided into successive batches, to a wet treatment in a bath containing a solution of hydrofluoric acid in water, during which wet treatment the conductivity of the solution is monitored and the silicon oxide-containing material is removed, thereby forming ionic components, which monitored conductivity is brought to approximately a desired conductivity at time intervals by adding hydrofluoric acid and/or water to the solution inside the bath.

An important wet treatment in IC manufacturing technology involves wet etching of silicon oxide-containing material, which is frequently carried out in a bath containing a solution of hydrofluoric acid in water ($HF/H_2O$). Consumption of fluoride containing components and formation of reaction products as a result of the removal of the silicon oxide-containing material, evaporation of water and/or hydrofluoric acid, and dragging into/out of water and chemicals when the substrates are, respectively, placed in/removed from the bath, are important factors influencing the chemical composition of the hydrofluoric acid solution over time. As the rate of etching or removal of the silicon oxide-containing material depends inter alia on the chemical composition of the hydrofluoric acid solution, it is important to monitor and control the chemical composition of the hydrofluoric acid solution so as to reach a better control of the etch process. An important category of techniques applied to monitor and control the chemical composition of solutions is based on the measurement of the solution's conductivity.

A method of the kind mentioned in the opening paragraph is known from an article entitled "In-situ chemical concentration control for substrate wet cleaning", written by Ismail Kashkoush et al. and published in Mat. Res. Soc. Symp. Proc., Vol. 477 (1997), pp. 311–316.

It has been experimentally observed that, although the conductivity of the hydrofluoric acid solution inside the bath is accurately controlled by bringing the monitored conductivity to approximately the desired conductivity at the time intervals, a decrease in removal or etch rate of the silicon oxide-containing material takes place from batch to batch during the wet treatment of the successive batches of substrates. In this way, the process stability of the wet treatment of the successive batches deteriorates, and the lifetime of the hydrofluoric acid solution is shortened.

SUMMARY OF THE INVENTION

It is an object of the invention to provide a method of the kind mentioned in the opening paragraph, which method improves the process stability of the wet treatment of successive batches of substrates, which are provided at a surface with a silicon oxide-containing material which is to be removed later, said wet treatment being carried out in a bath containing a solution of hydrofluoric acid in water, and lengthens the lifetime of the solution.

According to the invention, this object is achieved in that prior to the wet treatment the solution is provided with a basic component MX so that the monitored conductivity of the solution decreases as a result of the removal of the silicon oxide-containing material in between the time intervals of the wet treatment, the basic component MX comprising a cation $M^{(+)}$, which is different from $H^+$, and an anion $X^{(-)}$, which anion is a conjugated base of a weak acid.

The invention is based inter alia on the insight that the increase of the conductivity owing to the ionic components formed in the reaction between the hydrofluoric acid and the silicon oxide-containing material present at the surface of the substrates is larger than the decrease of the conductivity owing to the fluoride-containing ionic components consumed in this reaction. Hence, as a result of the removal of the silicon oxide-containing material in between the time intervals of the wet treatment, the conductivity of the solution increases. Simultaneously, the etch rate of the silicon oxide-containing material decreases owing to the consumption of hydrofluoric acid. Based on the monitored conductivity, water is added to the solution to bring the conductivity to approximately the desired value, whereas actually hydrofluoric acid should be added to bring the etch rate to approximately the desired value. Because of the addition of water to the solution, the concentration of hydrofluotic acid in the solution decreases further, which in turn results in a further decline of the etch rate of the silicon oxide-containing material. This decline in etch rate can be counteracted by the addition of a basic component MX to the solution prior to the wet treatment of the successive batches of substrates, thus causing the increase of the conductivity owing to the ionic components formed as a result of the removal of the silicon oxide-containing material to be smaller than the decrease of the conductivity owing to the fluoride-containing ionic components consumed as a result of this removal. The basic component MX should comprise a cation $M^{(+)}$, which is different from $H^+$, and an anion $X^{(-)}$, the anion being a conjugated base of a weak acid, which means that, if the basic component MX is added to water, the anion of the component may react with a proton to form HX. Using the measure in accordance with the invention, the conductivity of the solution changes in the same direction in between the time intervals of the wet treatment as the etch rate of the silicon oxide-containing material does. As a consequence, addition of hydrofluoric acid is required on the basis of conductivity as well as on the basis of etch rate. In this way, the process stability of the wet treatment is improved, and the lifetime of the solution is lengthened.

For reasons of adequacy, the basic component is advantageously added to the solution in an amount which is determined on the basis of the amount of silicon oxide containing material to be removed during the wet treatment of the successive batches of substrates. A further improvement of the process stability of the wet treatment and the lifetime of the solution can be accomplished by adding, apart from hydrofluoric acid, a further basic component MX to the solution at the time intervals, so that in addition the etch rate is brought to approximately a desired etch rate at the time intervals, the further basic component MX comprising a cation $M^{(+)}$, which is different from $H^+$, and an anion $X^{(-)}$, which anion is a conjugated base of a weak acid.

For reasons of adequacy, the hydrofluoric acid and the further basic component are added to the solution at the time intervals in a ratio which is determined on the basis of the composition of the solution adjusted prior to the wet treatment of the successive batches of substrates and the amount of silicon oxide-containing material to be removed during the wet treatment of the successive batches of substrates.

In order to reduce the complexity of the process, it is advantageous to apply one and the same component as the basic component, which is added to the solution prior to the wet treatment, and as the further basic component, which is added to the solution at the time intervals.

As the effect on the monitored conductivity of the ionic components formed as a result of the removal of the silicon oxide-containing material from the surface of the substrates is more pronounced for dilute solutions, the method in accordance with the invention is more effective if the solution of hydrofluoric acid in water is applied as a dilute solution. Moreover, as a result of the continued miniaturization of semiconductor devices, dilute solutions of hydrofluoric acid in water are becoming increasingly important in IC manufacturing technology. Dilute solutions with a weight percentage (wt. %) HF in the range from about 0.001 to 5.0 are advantageously applied for the wet etching of thin silicon oxide containing layers, that is to say silicon oxide-containing layers having a thickness of a few nanometers up to several tens of nanometers.

Further advantageous embodiments of the method in accordance with the invention are described in other dependent claims.

The invention further relates to an apparatus for carrying out the method as claimed in any one of the preceding claims, the apparatus comprising a bath containing the solution and accommodating the substrates, supply means for supplying the hydrofluoric acid and the water to the bath, means for monitoring the conductivity of the solution, and control means for bringing the monitored conductivity to approximately the desired conductivity at the time intervals.

Such an apparatus is known from an article entitled "In-situ chemical concentration control for substrate wet cleaning", written by Ismail Kashkoush et al., published in Mat. Res. Soc. Symp. Proc., Vol. 477 (1997), pp. 311–316.

In order to improve the process stability of the wet treatment of successive batches of substrates, which are provided at a surface with a silicon oxide-containing material to be removed, in a bath containing a solution of hydrofluoric acid in water, and to lengthen the lifetime of the solution, the apparatus in accordance with the invention is characterized in that it comprises further supply means for supplying the basic component to the bath.

BRIEF DESCRIPTION OF THE DRAWING

These and other aspects of the invention will be apparent from and elucidated with reference to the embodiments described hereinafter and shown in the drawing. In the drawing.

DESCRIPTION OF THE PREFERRED EMBODIMENTS

Figure 1:
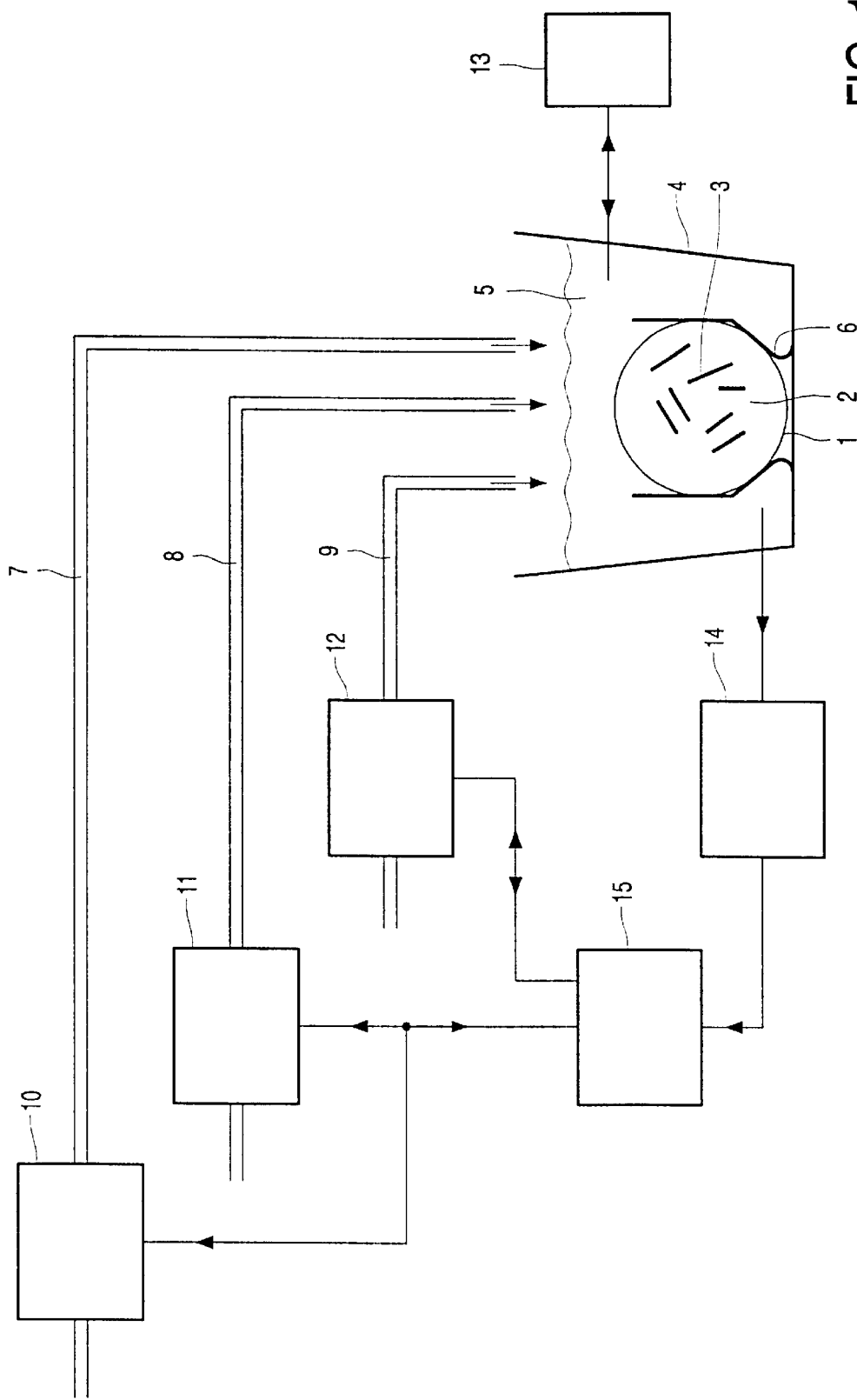
FIG. 1 diagrammatically shows view an apparatus in accordance with the invention.

FIG. 1 shows an apparatus for carrying out a method for wet treating successive batches of substrates 1 (only one substrate shown), which substrates 1 are provided at a surface 2 with a silicon oxide-containing material 3 to be removed. The apparatus comprises a bath 4 containing a solution 5 of hydrofluoric acid (HF) in water ($H_2O$), which solution 5 is provided with a basic component MX. The basic component MX should comprise a cation $M^{(+)}$, which is different from $H^+$, and an anion $X^{(-)}$, the anion being a conjugated base of a weak acid, which means that, if the basic component MX is added to water, the anion of the component may react with a proton to form HX. In this respect, ammonium fluoride ($NH_4F$) can be advantageously used, although other basic components such as, for example, ammonium hydroxide ($NH_4OH$), tetramethyl ammonium hydroxide ($NMe_4OH$), tetramethyl ammonium fluoride ($NMe_4F$), and ammonium acetate ($NH_4Ac$) may also be used. In this solution 5, the batches of substrates 1 are successively immersed and wet treated. The substrates 1 of each one of the successive batches may be loaded on a cassette or boat 6.

The hydrofluoric acid and the basic component, in the present example ammonium fluoride ($NH_4F$), can be supplied to the bath 4 from containers (not shown) placed upstream of supply lines 7,8, which supply lines 7,8 include flow control valves 10,11 for controlling the amounts of the hydrofluoric acid and the basic component admitted into the bath 4. Water can be supplied to the bath 4 via supply line 9 which includes a flow control valve 12 for controlling the amount of water admitted into the bath.

A heater 13 may be present in a recirculation loop (not shown) of the bath 4 for heating the solution 5 to a desired temperature. Means 14 for monitoring the conductivity of the solution 5 are present, which means 14 comprise, for example, an electrodeless "flow-through" conductivity sensor positioned in the above-mentioned recirculation loop. Such a sensor monitors the conductivity of the solution 5 by inducing an alternating current in a closed loop of the solution 5 and measuring the magnitude of the current, the current being proportional to the conductivity of the solution 5. The monitored conductivity, or a signal, for example a magnified current, which is proportional to said conductivity, is passed on to control means 15. The control means 15 compare the monitored conductivity with a desired conductivity, that is to say a target conductivity established by the composition of the solution prior to the wet treatment of the successive batches of substrates 1, and carry out a corrective action in order to bring the monitored conductivity to approximately about the desired conductivity at the time intervals during the wet treatment.

In the corrective action, hydrofluoric acid and/or water is added to the solution 5 inside the bath 4, which hydrofluoric acid is added together with a further basic component MX. The further basic component MX should comprise a cation $M^{(+)}$, which is different from $H^+$, and an anion $X^{(-)}$, the anion being a conjugated base of a weak acid, which means that, if the basic component MX is added to water, the anion of the component may react with a proton to form HX. The hydrofluoric acid and the further basic component both contribute to the monitored conductivity and jointly bring the monitored conductivity to approximately the desired conductivity at the time intervals. In addition, the hydrofluoric acid and the further basic component also jointly bring the etch rate of the silicon oxide-containing material to approximately a desired etch rate at these time intervals. The desired etch rate is a target etch rate, which is set prior to the wet treatment of the successive batches of substrates 1 by adjusting the composition of the solution inside the bath. It is advantageous to apply one and the same component as the basic component, in the present example ammonium fluoride ($NH_4F$), and as the further basic component, although other basic components such as, for example, ammonium fluoride ($NH_4F$), ammonium hydroxide ($NH_4OH$), tetramethyl ammonium hydroxide ($NMe_4OH$), tetramethyl ammonium fluoride ($NMe_4F$), and ammonium acetate ($NH_4Ac$) can be advantageously applied.

Specifically, when a drop in the monitored conductivity of the solution 5 of hydrofluoric acid (HF) and ammonium fluoride ($NH_4F$) in water is detected, a signal is sent by the control means 15 to the flow control valves 10,11 in order to add hydrofluoric acid and ammonium fluoride to the solution 5 inside the bath 4. Alternatively, when a rise in the monitored conductivity of the solution 5 is detected, a signal is sent by the control means 15 to the flow control valve 12 in order to add deionized water to the solution 5 inside the bath 4. The flow control valve 12 may also be controlled by a level sensor (not shown).

Figure 2:
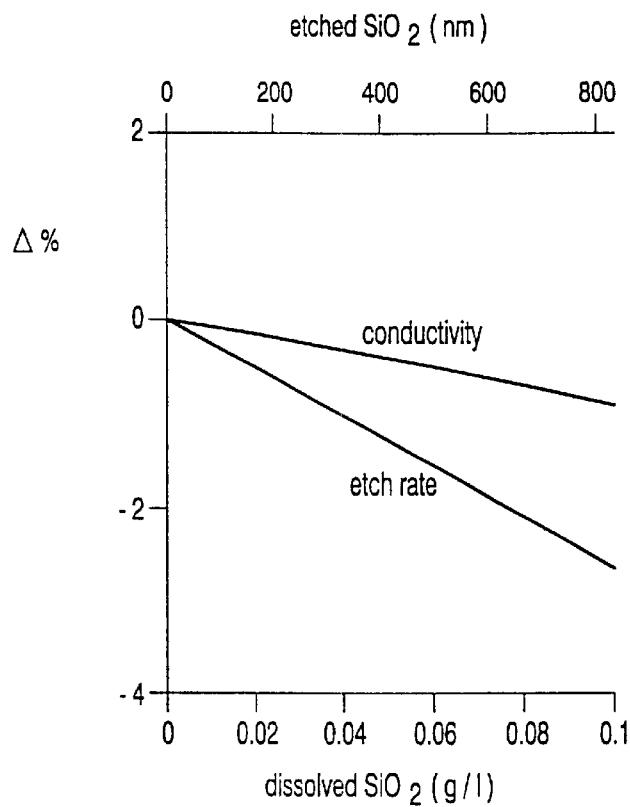
FIG. 2 is a graph showing the variation ($\Delta$ in %) of the monitored conductivity and the etch rate as a function of the amount of silicon oxide removed from the surface of 25 200 mm substrates (etched $SiO_2$ in nm) and dissolved (dissolved $SiO_2$ in gram/liter) in a bath containing 30 liters of a 0.82 wt. % solution of hydrofluoric acid in water, which solution is provided with 0.1 molar (M) ammonium fluoride ($NH_4F$) prior to the removal of the silicon oxide.
Figure 3:
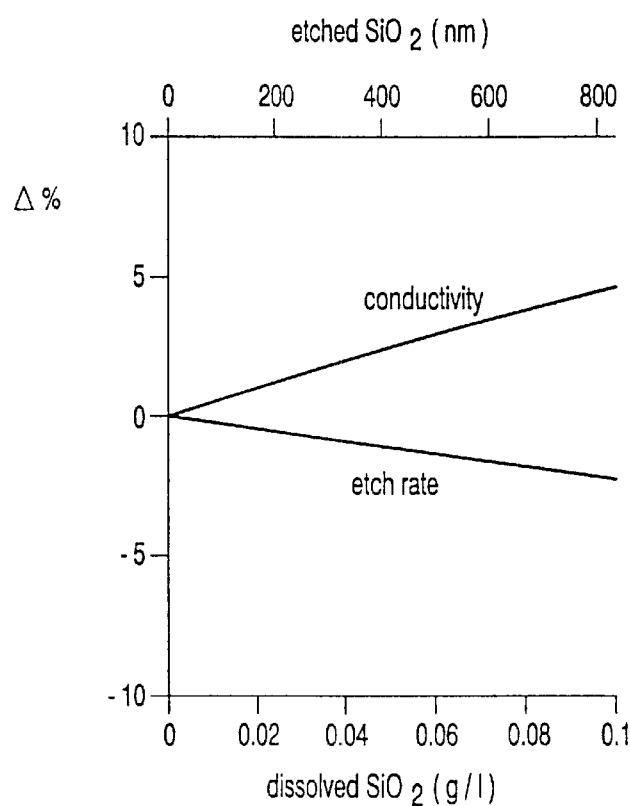
FIG. 3 is a graph showing the variation ($\Delta$ in %) in the monitored conductivity and the etch rate as a function of the amount of silicon oxide removed from the surface of 25 200 mm substrates (etched $SiO_2$ in nm) and dissolved (dissolved $SiO_2$ in gram/liter) in a bath containing 30 liters of a 1 wt. % solution of hydrofluoric acid in water.

FIG. 2 shows the variation ($\Delta$ in %) in the monitored conductivity and the etch rate as a function of the amount of silicon oxide removed from the surface of 25 200 mm substrates (etched $SiO_2$ in nm) and dissolved (dissolved $SiO_2$ in gram/liter) in a bath containing 30 liters of a 0.82 wt. % solution of hydrofluoric acid in water, which solution is provided with 0.1 molar (M) ammonium fluoride ($NH_4F$) prior to the removal of the silicon oxide. The basic component ($NH_4F$) is applied in an amount which is determined on the basis of the amount of silicon oxide to be removed during the wet treatment, in the present example 0.1 gram of silicon oxide is dissolved for each liter of solution. For comparison, FIG. 3 shows the results of a similar experiment, with this difference that it is conducted in a bath containing 30 liters of a 1 wt. % solution which does not contain ammonium fluoride. In both cases no chemicals are added during the removal of the silicon oxide in order to bring the monitored conductivity to approximately the desired conductivity.

Clearly, when the solution of hydrofluoric acid in water is not provided with a basic component, the monitored conductivity of the solution increases whereas the etch rate of the silicon oxide decreases as a function of the amount of silicon oxide removed. As mentioned before, these contradicting trends cause a deterioration of the process stability of the wet treatment and shorten the lifetime of the solution. On the contrary, when the solution of hydrofluoric acid in water is provided with a basic component prior to the wet treatment, in the present example 0.1 M $NH_4F$, the monitored conductivity as well as the etch rate decrease as a function of the amount of silicon oxide removed.

Figure 4:
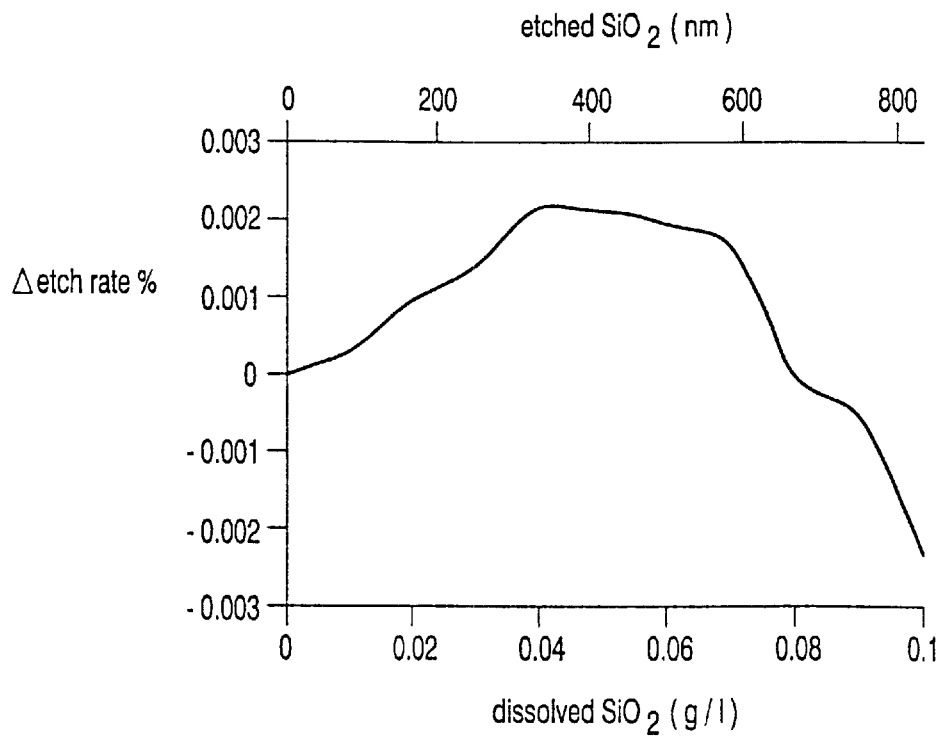
FIG. 4 is a graph showing the variation in etch rate ($\Delta$ etch rate in %) as a function of the amount of silicon oxide removed from the surface of 25 200 mm substrates (etched $SiO_2$ in nm) and dissolved (dissolved $SiO_2$ in gram/liter) in a bath containing 30 liters of a 0.82 wt. % solution of hydrofluoric acid in water, which solution is provided with 0.1 molar (M) ammonium fluoride ($NH_4F$), and hydrofluoric acid and ammonium fluoride ($NH_4F$) in a ratio of 1 to 0.088 and/or water are added to this solution at the time intervals.
Figure 5:
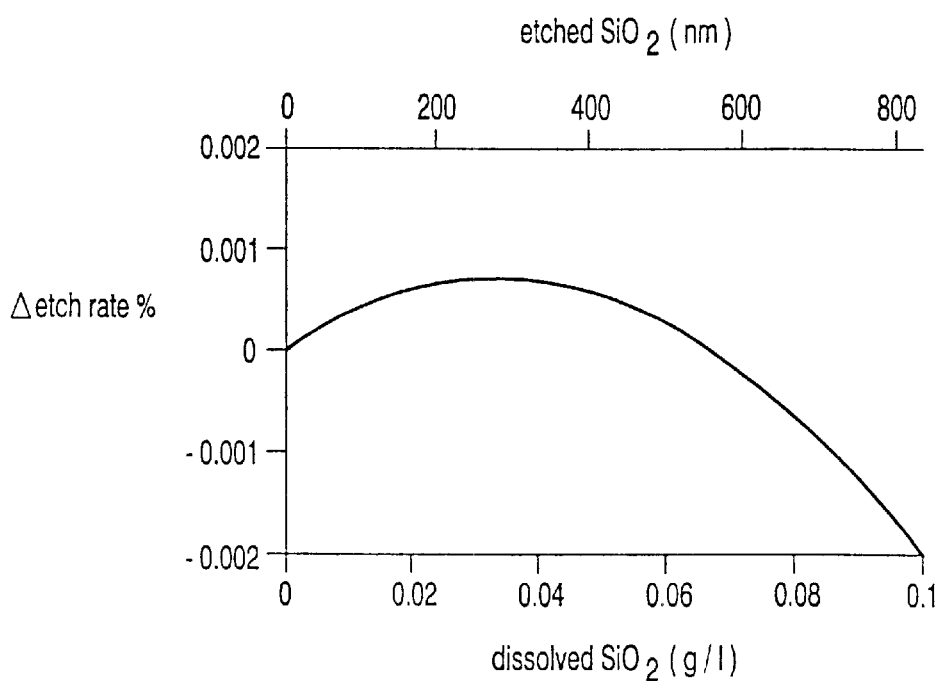
FIG. 5 is a graph showing the variation in etch rate ($\Delta$ etch rate in %) as a function of the amount of silicon oxide removed from the surface of 25 200 mm substrates (etched $SiO_2$ in nm) and dissolved (dissolved $SiO_2$ in gram/liter) in a bath containing 30 liters of a 0.64 wt. % solution of hydrofluoric acid in water, which solution is provided with 0.2 molar (M) ammonium fluoride ($NH_4F$), and hydrofluoric acid and ammonium fluoride ($NH_4F$) in a ratio of 1 to 0.065 and/or water are added to this solution at the time intervals.

FIG. 4 shows the variation in etch rate ($\Delta$ etch rate in %) as a function of the amount of silicon oxide removed from the surface of 25 200 mm substrates (etched $SiO_2$ in nm) and dissolved (dissolved $SiO_2$ in gram/liter) in a bath containing 30 liters of a 0.82 wt. % solution of hydrofluoric acid in water, which solution is provided with 0.1 molar (M) ammonium fluoride ($NH_4F$). During the removal of the silicon oxide, the monitored conductivity is brought to approximately the desired conductivity by adding hydrofluoric acid and a further basic component, in the present example ammonium fluoride ($NH_4F$), in a ratio of 1 to 0.088 and/or water at the time intervals. The ratio in which the hydrofluoric acid and the further basic component ($NH_4F$) are added to the solution at the time intervals is determined on the basis of the composition of the solution adjusted prior to the wet treatment and the amount of silicon oxide to be removed during the wet treatment. FIG. 5 shows the results of a similar calculation, which is now conducted for a bath containing 30 liters of a 0.64 wt. % solution provided with 0.2 M $NH_4F$, to which solution HF and $NH_4F$ in a ratio of 1 to 0.065 and/or $H_2O$ are added at the time intervals to bring the monitored conductivity to approximately the desired conductivity.

Clearly, the etch rate of silicon oxide is very stable in both situations. The variation in etch rate is less than 0.1%. It should be noted that these calculations reflect more or less ideal situations, that is to say situations in which water evaporation and dragging into/out of water and/or chemicals are not taken into account.

It will be apparent that the invention is not limited to the embodiments described above, but that many variations are possible to those skilled in the art within the scope of the invention.

Besides etching of silicon oxide, the invention can also be advantageously applied for etching of glass layers. Moreover, the composition of the solution inside the bath can be made in several ways. In the above-described embodiments, the hydrofluoric acid, the basic component and the water are admitted into the bath from separate supply lines. However, in order to reduce the process complexity, it may be advantageous in some cases to admit the hydrofluoric acid and the basic component as a mixture into the bath prior to the wet treatment of the successive batches of substrates. Furthermore, in order to improve the accuracy with which the monitored conductivity as well as the etch rate need to be brought to approximately the desired values at the time intervals, the hydrofluoric acid and the further basic component may be advantageously added to the solution as a mixture at these time intervals.

Although the invention can be applied successfully in the manufacture of semiconductor devices, which are also referred to as active devices, the invention is also applicable for the benefit of passive devices such as, for example, thin-film capacitors and resistors. Besides substrates comprising semiconductor bodies, which are commonly applied in the manufacture of semiconductor devices, the method of the invention can also be advantageously applied for substrates comprising, for example, glass bodies or silicon-on-insulator (SOI) bodies. Glass bodies can be used in the manufacture of, for example, thin-film transistors and active arrays for driving liquid crystal displays (LCD's), whereas silicon-on-insulator (SOI) bodies can be used for highvoltage devices, and high-frequency devices for e.g. telecom applications. Furthermore, the apparatus for carrying out the method in accordance with the invention may be part of a so-called wet bench comprising a series of baths.

What is claimed is:

1. A method of manufacturing electronic devices, in particular, but not exclusively, semiconductor devices, in which method substrates, which are provided at a surface with a silicon oxide-containing material which is to be removed later, are subjected, while being divided into successive batches, to a wet treatment in a bath containing a solution of hydrofluoric acid in water, during which wet treatment the conductivity of the solution is monitored and the silicon oxide-containing material is removed, thereby forming ionic components, which monitored conductivity is brought to approximately a desired conductivity at time intervals by adding hydrofluoric acid and/or water to the solution inside the bath, characterized in that prior to the wet treatment the solution is provided with a basic component MX so that the monitored conductivity of the solution decreases as a result of the removal of the silicon oxide-containing material in between the time intervals of the wet treatment, the basic component Mx comprising a cation $M^{(+)}$, which is different from H, and an anion $X^{(-)}$, which anion is a conjugated base of a weak acid.

2. A method as claimed in claim 1, characterized in that the basic component is added to the solution in an amount which is determined on the basis of the amount of silicon oxide-containing material to be removed during the wet treatment of the successive batches of substrates.

3. A method as claimed in claim 1, characterized in that besides hydrofluoric acid a further basic component MX is added to the solution at the time intervals so that in addition the etch rate is brought to approximately a desired etch rate at the time intervals, the further basic component MX comprising a cation $M^{(+)}$, which is different from $H^+$, and an anion $X^{(-)}$, which anion is a conjugated base of a weak acid.

4. A method as claimed in claim 3, characterized in that the hydrofluoric acid and the further basic component are added to the solution at the time intervals in a ratio which is determined on the basis of the composition of the solution adjusted prior to the wet treatment and the amount of silicon oxide-containing material to be removed during the wet treatment of the successive batches of substrates.

5. A method as claimed in claim 3, characterized in that one and the same component is applied as the basic component, which is added to the solution prior to the wet treatment, and as the further basic component, which is added to the solution at the time intervals.

6. A method as claimed in claim 5, characterized in that $NH_4F$ is applied as the component.

7. A method as claimed in any claim 1, characterized in that the solution of hydrofluoric acid in water is applied as a dilute solution.

8. A method as claimed in any claim 1, characterized in that the hydrofluoric acid is applied in a weight percentage in the range from about 0.001 to 5.0.

9. An apparatus for carrying out the method as claimed in claim 1, the apparatus comprising a bath for containing the solution and accommodating the substrates, supply means for supplying the hydrofluoric acid and the water to the bath, means for monitoring the conductivity of the solution, and control means for bringing the monitored conductivity to approximately the desired conductivity at the time intervals, characterized in that the apparatus comprises further supply means for supplying the basic component to the bath.

* * * * *